(12) United States Patent
Ashe et al.

(10) Patent No.: US 6,618,943 B2
(45) Date of Patent: Sep. 16, 2003

(54) METHOD OF MANUFACTURING A DROPLET DEPOSITION APPARATUS

(75) Inventors: James Ashe, Edinburgh (GB); Christopher David Phillips, Beds (KR); Stephen Temple, Cambridge (KR)

(73) Assignee: Xaar Technology Limited, Cambridge (GB)

( * ) Notice: Subject to any disclaimer, the term of this patent is extended or adjusted under 35 U.S.C. 154(b) by 0 days.

(21) Appl. No.: 09/949,333

(22) Filed: Sep. 7, 2001

(65) Prior Publication Data

US 2002/0005880 A1 Jan. 17, 2002

Related U.S. Application Data

(62) Division of application No. 09/152,571, filed on Sep. 14, 1998, now Pat. No. 6,286,943.

(30) Foreign Application Priority Data

Apr. 23, 1996 (GB) .............................................. 9608373
Nov. 23, 1996 (GB) .............................................. 9624408

(51) Int. Cl.$^7$ .............................................. B21D 53/76
(52) U.S. Cl. ...................... 29/890.1; 29/25.35; 29/846; 427/100; 347/68; 347/65; 310/365; 310/366
(58) Field of Search ............................ 29/890.1, 25.35, 29/846; 310/365, 366; 347/68, 69, 65, 47; 427/97, 99, 100

(56) References Cited

U.S. PATENT DOCUMENTS

| | | | |
|---|---|---|---|
| 3,245,895 A | | 4/1966 | Baker et al. ................ 204/164 |
| 4,828,870 A | | 5/1989 | Ando et al. .................... 427/38 |
| 4,997,673 A | | 3/1991 | Ogata et al. ................... 427/38 |
| 5,053,245 A | | 10/1991 | Kiyama et al. ................ 427/38 |
| 5,193,256 A | * | 3/1993 | Ochiai ........................ 29/25.35 |
| 5,406,319 A | | 4/1995 | Hayes et al. .................. 347/71 |
| 5,421,071 A | * | 6/1995 | Kanegae ..................... 29/25.35 |
| 5,619,235 A | * | 4/1997 | Suzuki ......................... 347/69 |
| 5,677,717 A | * | 10/1997 | Ohashi ......................... 347/69 |
| 5,680,163 A | * | 10/1997 | Sugahara ..................... 347/71 |
| 5,719,606 A | * | 2/1998 | Kigawa ........................ 347/69 |

FOREIGN PATENT DOCUMENTS

| | | |
|---|---|---|
| EP | 0 364 136 A2 | 4/1990 |
| EP | 0 666 173 A2 | 8/1995 |
| JP | 07101056 | 4/1995 |
| JP | 07-132591 A | 5/1995 |
| JP | 07304169 | 11/1995 |
| JP | 09/207331 A | 2/1996 |

OTHER PUBLICATIONS

"Laser Deposition of AlN Thin Films on InP and GaAs", Bhattacharya et al., Japanese Journal of Applied Physics, vol. 30, No. 10A, Oct. 1991, pp. L1750–L1752.

* cited by examiner

Primary Examiner—A. Dexter Tugbang
Assistant Examiner—Alan M. Boswell
(74) Attorney, Agent, or Firm—Marshall, Gerstein & Borun

(57) ABSTRACT

A drop-on-demand piezo-electric printhead has channel walls defined by piezo-electric material (10) with electrodes (26) along the length thereof. In portions of the channels which are open to an ink supply conduit, the piezo material is locally disabled, e.g. by reducing the width of the electrode or by interposing a material (40) of lower dielectric constant between the electrode and the piezo material. A lower capacitive load results.

7 Claims, 7 Drawing Sheets

PRIOR ART

METHOD OF MANUFACTURING A DROPLET DEPOSITION APPARATUS

RELATED APPLICATION DATA

This patent is a division of U.S. application Ser. No. 09/152,571, filed Sep. 14, 1998, now issued as U.S. Pat. No. 6,286,943.

FIELD OF THE INVENTION

The present invention relates to droplet deposition apparatus, in particular inkjet printheads, having a bottom sheet comprising piezo-electric material and formed with a multiplicity of parallel, open-topped channels mutually spaced in an array direction normal to the length of the channels, each channel being defined at least in part by facing side walls and by a bottom surface extending between said side walls, at least the side walls comprising said piezo-electric material. The present invention also includes methods of manufacture of such apparatus.

BACKGROUND OF THE INVENTION

Such printheads are known in the art—e.g. from EP-A-0 277 703, EP-A-0 278 590 and EP-A-0 364 136—and employ piezoelectric material actuated in its shear mode to vary the volume of an ink chamber and thereby eject an ink drop. EP-A-0 341 929 describes a method for driving such actuators and makes clear that the actuators each have a capacitive load. As will be generally understood, such a capacitive load makes current and power demands which affect both size and cost of the driving circuitry. Furthermore, it has been recognised by the present inventors that current flowing in the circuitry and electrodes of the printhead itself may also lead to heat generation which in turn will affect the viscosity of the ink: as is the case in many types of inkjet apparatus, variation in ink viscosity will result in a variation in the velocity of the ejected ink droplet which will in turn manifest itself as a droplet placement error in the printed image.

SUMMARY OF THE INVENTION

It has been proposed to decrease the capacitive load of a printhead by restricting the use of piezoelectric material in the printhead to those areas where piezoelectric activity is actually required—i.e. in the channel walls of the "active" (closed) portions of the channels—and using material having a lower dielectric coefficient for the remainder of the printhead. This may be achieved in practice by "letting in" an insert of piezo-electric material into a lower dielectric base, forming channels that pass through both the insert and the base and depositing electrodes along the length of each channel. Only that part of each channel wall which comprises piezoelectric material will distort in response to an electric field applied via the electrodes, with the remainder of each wall and any associated connection area only presenting a low capacitive load. The "letting in" of the piezoelectric insert is a complex process however and therefore renders this technique expensive.

The present invention has as an objective printheads that have a lower capacitive load than known constructions and yet are not complex to produce. Methods of manufacture of such printheads are also comprised in the present invention.

Accordingly, the present invention consists in droplet deposition apparatus comprising a bottom sheet comprising piezo-electric material and formed with a multiplicity of parallel, open-topped channels mutually spaced in an array direction normal to the length of the channels, each channel being defined at least in part by facing side walls and by a bottom surface extending between said side walls;

at least the side walls comprising said piezo-electric material and electrodes for applying an electric field to said piezo-electric material, thereby to effect transverse displacement of said side wall;

a top sheet facing said bottom surfaces of said channels and bonded to said side walls to close said channels at the tops thereof;

the channels being supplied with droplet liquid fluid and communicating with a nozzle for ejection of droplets therefrom; each channel having one portion open on a side lying parallel to the channel axis for communication with droplet fluid supply means and another portion which is closed on all sides lying parallel to the channel axis;

characterised in that the respective side walls comprising said piezo-electric material in said one portion of each channel are disabled such that transverse displacement of said side walls in said one portion of each channel does not take place.

It has been recognised by the present inventors that not only is transverse displacement of the walls in 'open' sections of the channel unnecessary but that by disabling the walls in such 'open' sections, a reduction in the overall capacitative load can be achieved in printheads manufactured according to the substantially conventional technique of forming channels in a base comprising a uniform layer of piezo-electric material. The complex manufacturing methods described above can therefore be avoided.

According to a first preferred aspect, the invention consists in droplet deposition apparatus comprising a bottom sheet having a layer of piezo-electric material poled in a direction normal to said layer and formed with a multiplicity of parallel, open-topped channels mutually spaced in an array direction normal to the length of the channels, each channel being defined at least in part by facing side walls and by a bottom surface extending between said side walls, at least the side walls comprising said piezo-electric material;

a top sheet facing said bottom surfaces of said channels and bonded to said side walls to close said channels at the tops thereof;

the channels being supplied with droplet liquid fluid and communicating with a nozzle for ejection of droplets therefrom;

each channel having one portion open on a side lying parallel to the channel axis for communication with droplet fluid supply means and another portion which is closed on all sides lying parallel to the channel axis;

electrodes provided on opposite sides of said side walls, thereby to form shear mode actuators for effecting droplet expulsion from the channels associated with said actuators, each electrode extending substantially the length of the channel; characterised in that, in said one portion of said channel a layer of material having a dielectric constant lower than that of the piezoelectric material is interposed between said piezo-electric material and at least one of said electrodes provided on opposite sides of said side walls.

Such apparatus achieves a lower capacitance than conventional designs without the complexity associated with "let-in" piezoelectric inserts as described above. In said one portion of the channel which is open to ink supply means, the walls do not need to be displaceable. Consequently the electrodes in such a portion can be separated from the piezoelectric material of the channel walls by a layer of material having a lower dielectric constant than the piezo-electric material thereby disabling that part of the piezo electric material. The resulting capacitive load between the electrodes on opposite sides of the channel wall in this one portion is lower than that obtained with piezoelectric material alone (as is the case in said another "closed" portion of the channel) and thereby contributes to a reduction in the total capacitive load of the printhead.

According to a particular embodiment, said-one and another portions are each defined at least in part by side walls having co-planar top surfaces and being of substantially constant height, whereby the height of the respective side walls of said one and another portions is substantially equal. Such an embodiment is particularly amenable to manufacture, there being no variation in channel machining depth required in the forward part of the channels at least. In such an embodiment, said another portion of the channel may extend at a constant depth as far as the nozzle. Independently of this, said one and another portions may be contiguous.

Preferably the electrodes provided on opposite sides of the side walls are located at the top of each channel side wall, remote from said bottom surface. Such an arrangement is particularly amenable to deposition using the known "angled plating" principle. In particular, the electrode may advantageously extend over approximately half the depth of the respective channel wall in said another portion whilst in said one portion, the electrode preferably extends over 10% or less of the height of the respective channel wall.

Where each of said channels comprises a further portion having channel walls of lesser height than the channel walls of either said one or another portions, electrodes being provided on the facing channel walls and the bottom of said further portion of each of said channels, there is provided a layer of material having a dielectric constant lower than that of the piezoelectric material interposed between said electrodes and said facing walls and bottom of each channel. The electrodes in such a further portion serve as connection points between the electrodes in the channels and external driver chips. A layer of low dielectric material between these electrodes and the reduced-height channel walls reduces the capacitive load of these areas.

This aspect of the present invention also consists in a method of making a droplet deposition apparatus including the steps of (a) forming a multiplicity of parallel channels in a bottom sheet comprising a layer of piezo-electric material; (b) depositing a layer of material on at least one of the facing side walls of a first portion of each of said channels, the material having a dielectric constant lower than that of the piezo-electric material, the facing side walls of a second portion of each of said channels remaining free of said material; (c) depositing electrode material on the facing side walls of said first and second portions of said channels. Again, this method allows a low-capacitance printhead to be made without complexity by inventive use of deposition methods as are known per se.

Advantageously, the method involves masking said second portion of each of said channels prior to depositing said layer of material on at least one of the facing side walls of said first portion of each of said channels and then unmasking said second portion prior to depositing electrode material on the facing side walls of said first and second portions of said channels.

The electrode material is advantageously deposited by means of metal vapour beams directed at said walls and at angle to channel facing surfaces thereof.

This first aspect of the invention also covers droplet deposition apparatus comprising a bottom sheet comprising a layer of piezo-electric material poled in a direction normal to said layer and formed with a multiplicity of parallel, open-topped channels mutually spaced in an array direction normal to the length of the channels, each channel being defined at least in part by facing side walls having a height and a bottom surface extending between said side walls, at least the side walls comprising said piezo-electric material; a top sheet facing said bottom surfaces of said channels and bonded to said side walls to close said channels at the tops thereof; the channels being supplied with droplet liquid fluid and communicating with a nozzle for ejection of droplets therefrom; each channel having a portion which is closed on all sides lying parallel to the channel axis; electrodes provided at least on opposite sides of said side walls, thereby to form shear mode actuators for effecting droplet expulsion from the channels associated with said actuators, each electrode extending substantially the length of the channel; characterised in that a layer of material having a dielectric constant lower than that of the piezoelectric material is interposed between said piezoelectric material and at least one of said electrodes in areas other than said portion of each channel.

The first aspect of the invention also includes droplet deposition apparatus having a bottom sheet comprising piezo-electric material and formed with a multiplicity of parallel, open-topped channels mutually spaced in an array direction normal to the length of the channels, each channel being defined at least in part by facing side walls having a height and a bottom surface extending between said side walls, at least the side walls comprising said piezo-electric material; a top sheet facing said bottom surfaces of said channels and bonded to said side walls to close said channels at the tops thereof; the channels being supplied with droplet liquid fluid and communicating with a nozzle for ejection of droplets therefrom; each channel having a portion which is closed on all sides lying parallel to the channel axis; electrodes for applying an electric field to said piezo-electric material in said side walls; characterised in that, in areas other than said portion of each channel, a layer of material having a dielectric constant lower than that of the piezoelectric material is interposed between said piezoelectric material in said side walls and at least one of said electrodes.

Similar advantages are achieved by a second preferred aspect of the present invention. This consists in droplet deposition apparatus comprising a bottom sheet having a layer of piezo-electric material poled in a direction normal to said layer and formed with a multiplicity of parallel, open-topped channels mutually spaced in an array direction normal to the length of the channels, each channel being defined at least in part by facing side walls having co-planar top surfaces and by a bottom surface extending between said side walls, at least the side walls comprising said piezo-electric material; a top sheet facing said bottom surfaces of said channels and bonded to said side walls to close said channels at the tops thereof; the channels being supplied with droplet liquid fluid and communicating with a nozzle for ejection of droplets therefrom; each channel having one portion open on a side lying parallel to the channel axis for communication with droplet fluid supply means and another portion which is closed on all sides lying parallel to the channel axis; electrodes provided on opposite sides of said side walls, thereby to form shear mode actuators for effecting droplet expulsion from the channels associated with said actuators, each electrode extending substantially the length of the channel; characterised in that the electrodes provided in said one portion of each channel extend over a lesser proportion of the height of the respective side walls than do the electrodes provided in said another portion of each channel.

Such apparatus again achieves a lower capacitance than conventional designs in a simple manner. In said one portion of the channel which is open to ink supply means, the walls do not need to be displaceable and consequently the electrodes in such a portion need only extend over a (lesser) proportion of the channel wall height sufficient to convey the actuating voltages to the electrodes in the closed portion of the channel but insufficient to drive the piezo electric material in the open portion, which thus is locally disabled. In the closed portion, the electrodes extend a correspondingly greater proportion down the wall sufficient to cause the channel walls to move. In this way, the capacitive load of the channel walls in said one (open) portion at least is reduced relative to conventional designs, resulting in a reduction in the capacitance of the printhead as a whole.

According to a particular embodiment, said one and another portions are each defined at least in part by side walls of substantially constant height, whereby the height of the respective side walls of said one and another portions is substantially equal. Such an embodiment is particularly amenable to manufacture, there being no variation in channel machining depth required in the forward part of the channels at least. In such an embodiment, said another portion of the channel may extend at a constant depth as far as the nozzle. Independently of this, said one and another portions may be contiguous.

Preferably the electrodes provided on opposite sides of the side walls are located at the top of each channel side wall, remote from said bottom surface. Such an arrangement is particularly amenable to deposition using the known "angled plating" principle. In particular, in said one portion, the electrode preferably extends over 10% or less of the height of the respective channel wall.

The invention according to this second aspect is particularly advantageous in embodiments where the ratio of the lengths of said one and another channel portions is approximately 2 or greater.

The present invention also comprises a corresponding method of manufacture which includes the steps of (a) forming in a bottom sheet comprising a layer of piezo-electric material a multiplicity of parallel channels separated by channel walls having co-planar top surfaces, (b) depositing electrode material on the facing side walls of a first portion of each of said channels over a first proportion of the height of the respective side walls; (c) depositing electrode material on the facing side walls of a second portion of each of said channels over a second proportion of the height of the respective side walls, said first and second proportions being different.

Again, this inventive use of per se known deposition methods allows a low-capacitance head to be manufactured without complexity.

According to a preferred embodiment, the method includes the steps of masking said second portion of each of said channels prior to depositing electrode material on the facing walls of said first portion of each of said channels over a first proportion of the height of the respective side walls; and unmasking said second portion prior to depositing electrode material on the facing side walls of said first and second portions of each of said channels. Such a procedure is simple to realise and does not require the breaking of vacuum between deposition steps. Advantageously, the first proportion is greater than said second proportion, the second proportion being preferably no greater than 10% of the wall height. This may be achieved by an inventive use of the conventional technique of material deposition by means of metal vapour beams directed at said walls and at angle to channel facing surfaces thereof, the angle for deposition in said first portion being steeper that the angle for deposition in said second portion.

BRIEF DESCRIPTION OF THE DRAWINGS

The invention will now be described by way of example by reference to diagrams, of which:

FIGS. 1–3 show—in perspective and sectional views respectively—a typical ink jet printhead 8 incorporating piezo-electric wall actuators operating in shear mode and known, for example, from U.S. Pat. No. 5,016,028. It comprises a base 10 of piezo electric material mounted on a circuit board 12 of which only a section showing connection tracks 14 is illustrated.

DETAILED DESCRIPTION OF THE DISCLOSED EMBODIMENTS

A multiplicity of parallel grooves are formed in the base 10 extending into the layer of piezo electric material, as is described, for example, in U.S. Pat. No. 5,016,028. Each groove comprises a forward part which is comparatively deep to provide ink channels 20 separated by opposing actuator walls 22 having uniformly co-planar top surfaces, and a rearward part which is comparatively shallow to provide locations 23 for connection tracks. Forward and rearward parts are connected by a "runout" section R of the channel, the radius of which is determined by the radius of the cutting disc used to form the channels (and discussed, for example, in the aforementioned EP-A-0 364 136).

Figure 3A:
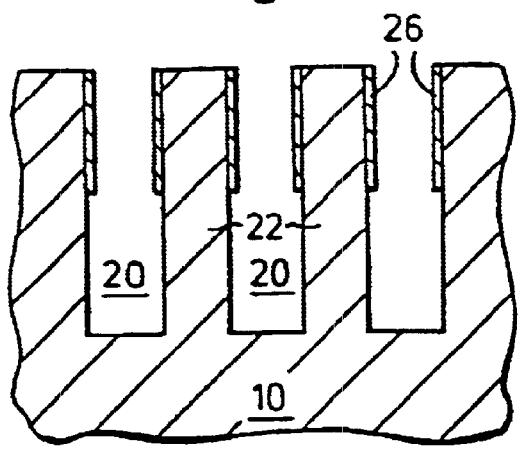
FIGS. 3(a),(b) and (c) are sectional views of part of the printhead of figure 1 taken along lines B—B, C—C and D—D respectively.
Figure 3B:
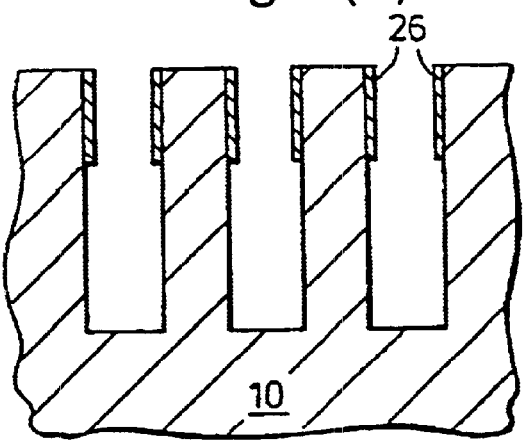
Figure 3C:
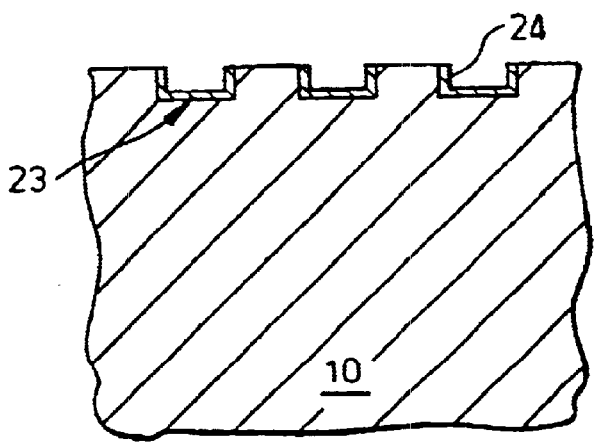

As illustrated in FIG. 3, after forming the grooves, metallized plating is deposited therein to provide in the forward part electrodes 26 on the opposing faces of the ink channels 20 where it extends approximately one half of the channel height from the tops of the walls (FIGS. 3(a) and (b)) and in the rearward part is deposited providing connection tracks 24 connected to the electrodes in each channel 20 (FIG. 3(c)). The tops of the walls are kept free of plating metal so that the track 24 and the electrodes 26 form isolated actuating electrodes for each channel. This metallisation technique is known in the art e.g. from the aforementioned EP-A-0 364 136.

Figure 1:
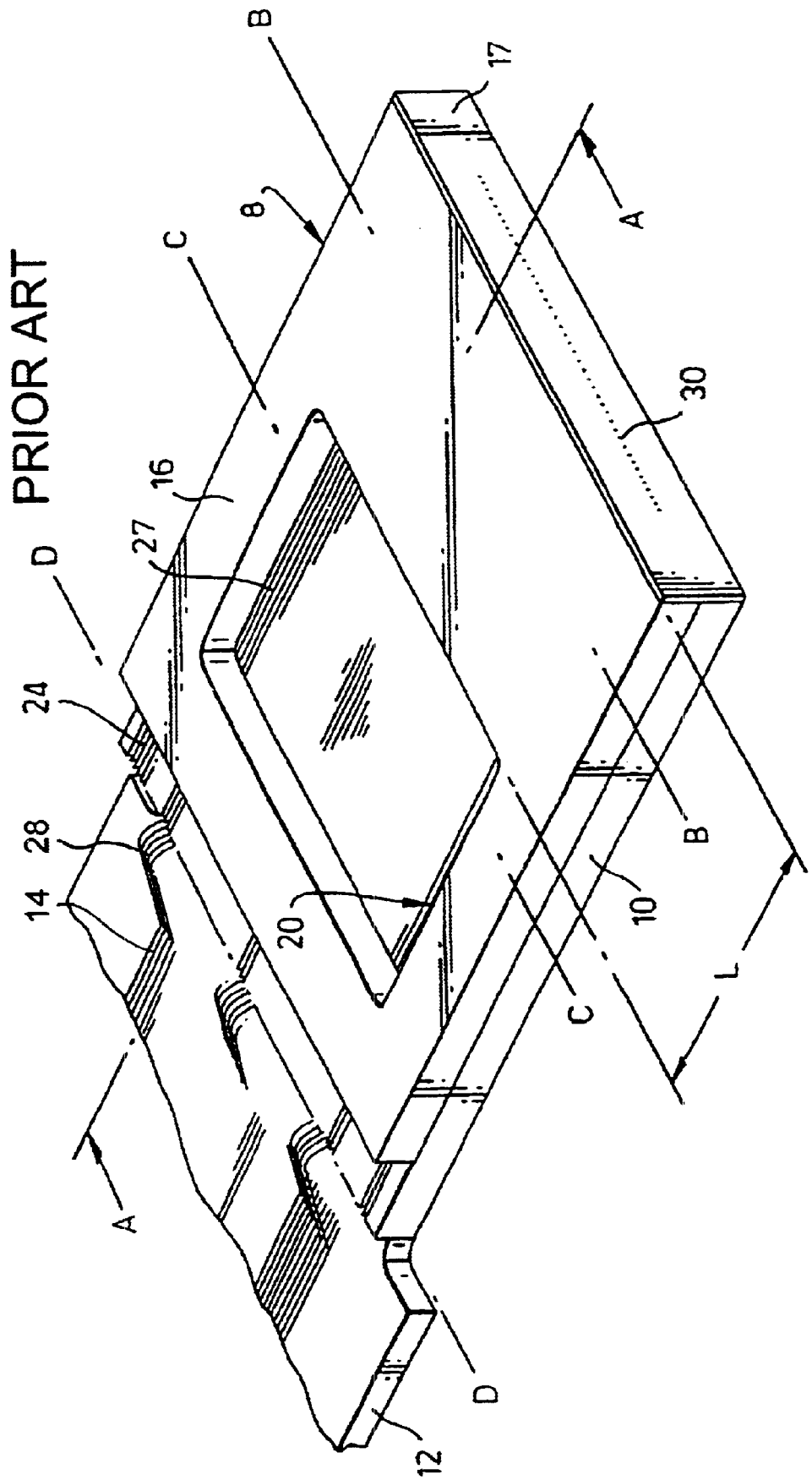
FIG. 1 is a perspective view of one form of conventional inkjet printhead to which the present invention can be applied.

Following deposition and—optionally—coating of the base 10 with a passivant layer for electrical isolation of the electrode parts from the ink, the base 10 is mounted as shown in FIG. 1 on the circuit board 12 and bonded wire connections 28 are made connecting the connection tracks 24 on the base part 10 to the connection tracks 14 on the circuit board 12.

A cover 16 is secured by bonding to the tops of the actuator walls 22 thereby forming a multiplicity of "closed" channels 20. At one end, each channel has access to a supply of replenishment ink—in the example shown this is via the window 27 in the cover 16. At the other end of each channel is located a nozzle 30 which may be formed (advantageously by UV excimer laser ablation) in a nozzle plate 17 bonded to the printhead.

In the example, the printhead is operated by delivering ink from an ink supply via the window 27, from where it is drawn into the ink channels 20 to the nozzles 30. As is known, e.g. from EP-A-0 277 703, appropriate application of voltage waveforms to the electrodes on either side of a channel wall will result in a potential difference being set up across the wall which in turn will cause the poled piezoelectric material of the channel walls to deform in shear mode and the wall to deflect transversely relative to the respective channel. One or both of the walls bounding an ink channel can be thus deflected.

Movement of the walls into the channel will decrease the channel volume and establish a pressure in the ink along that length of the channel closed on the top and bottom by the base and cover respectively and closed on both sides by respective channel walls. This length is known as the "active" length of the channel and is denoted in FIGS. 1 and 2 by "L". Dissipation of the pressure causes a droplet of ink to be expelled from the nozzle.

As mentioned above, printheads of the kind described present a capacitive load: in the forward part (corresponding to FIGS. 3(a) and (b)) a capacitor is formed by a channel wall and the electrodes located on either side, whilst in the rearward part of the channel, it will be understood that it is not only the (much-reduced) wall but also the piezo-electric base which, in combination with the connection tracks 24, contributes to the capacitive effect.

Figure 2:
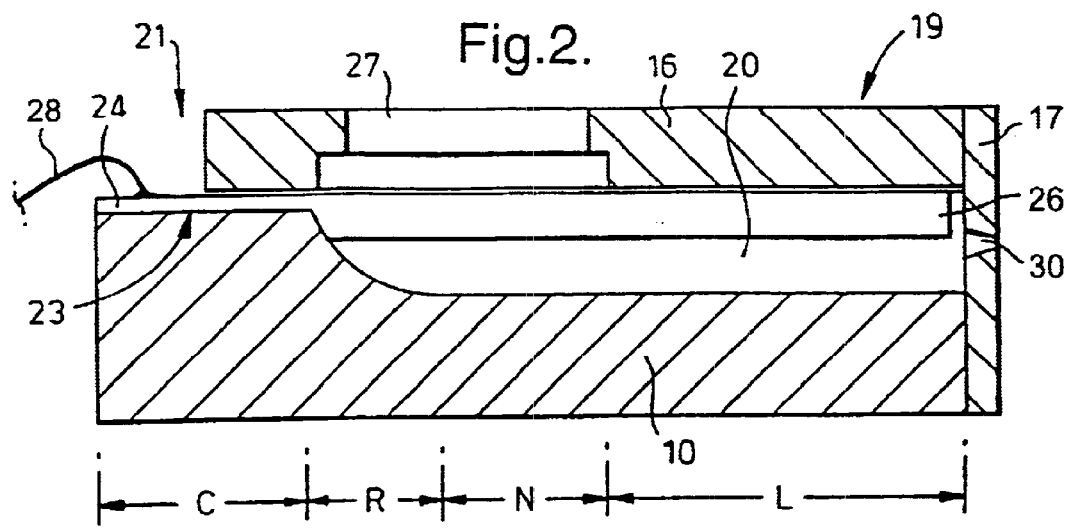
FIG. 2 is a sectional view of the printhead of FIG. 1 taken along the line A—A of FIG. 1.
Figure 4:
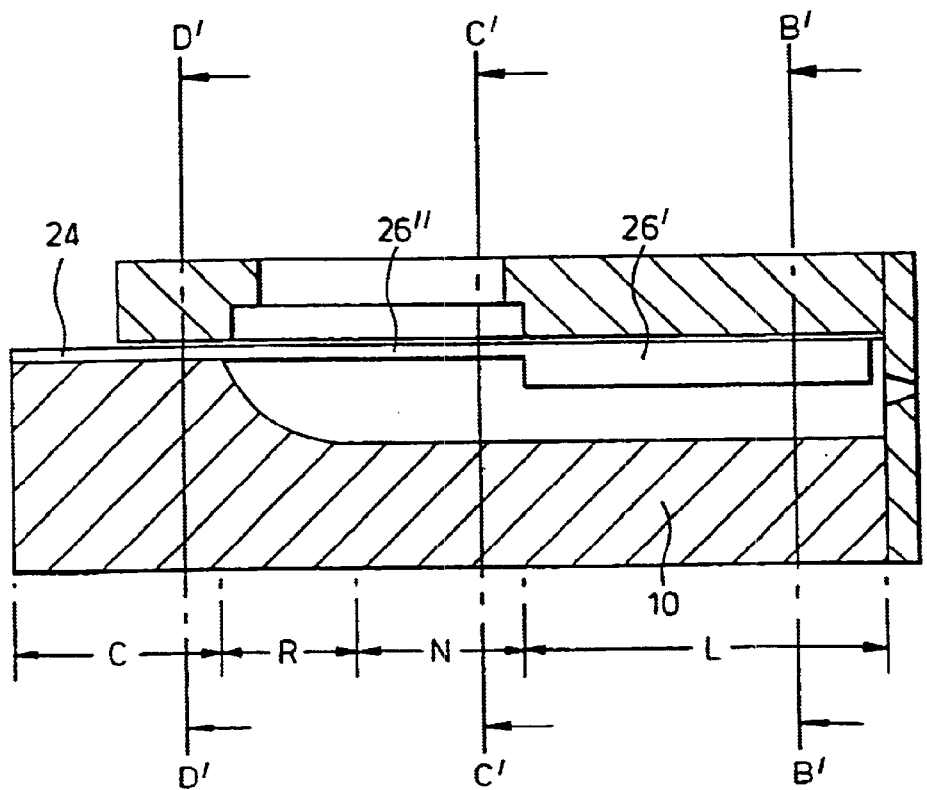
FIG. 4 is a sectional view corresponding to that of FIG. 2 and incorporating a first aspect of the invention.

FIG. 4 is a sectional view corresponding to FIG. 2 and illustrating a printhead according to a first aspect of the present invention. FIG. 5 shows corresponding sectional views. It will be seen that the construction of the "active" length of the printhead of FIG. 4 remains the same as that of the conventional head, with the electrode 26' extending approximately halfway down the wall.

However, in that portion of the full-depth channel—denoted by "N"—which is open on one side to the ink supply window 27 and therefore not part of the "active" length of the channel, the electrode 26" extends only along the very top portion of the wall. This is sufficient to convey actuation signals from the connection tracks 24 to the electrode 26' of the active channel portion, and yet—as will be evident from FIG. 5(b)—reduces considerably the capacitive load of this portion of channel by reducing the area of piezoelectric material located between the channel electrodes (this follows from the established principle that the capacitance C of a parallel plate capacitor having plates of area A separated by a thickness L of material having a relative dielectric constant K is given by $C = K \cdot e_o \cdot A/L$, where $e_o$ is the permittivity of free space).

The reduced depth electrode 26" is also advantageously used in the "runout" section R whence it joins up with the connection tracks 24 which are formed in the conventional manner.

As regards manufacture of the differing height tracks 26', 26" outlined above, this is advantageously—but not exclusively—achieved by metal vapour deposition. The principles of this technique are fully described in EP-A-0 364 136 and will not therefore be discussed here. The channelled piezoelectric body is initially exposed to a metal vapour beam directed perpendicularly to the plane of the body, i.e. substantially parallel to the channel side walls, with all but the rearward part "C" of the grooves shielded. As indicated by dashed lines 60 in FIG. 5(c), metal is thereby deposited to form connection tracks 24 of sufficient thickness to withstand the wire bonding process, typically 2–4 μm.

Figure 5A:
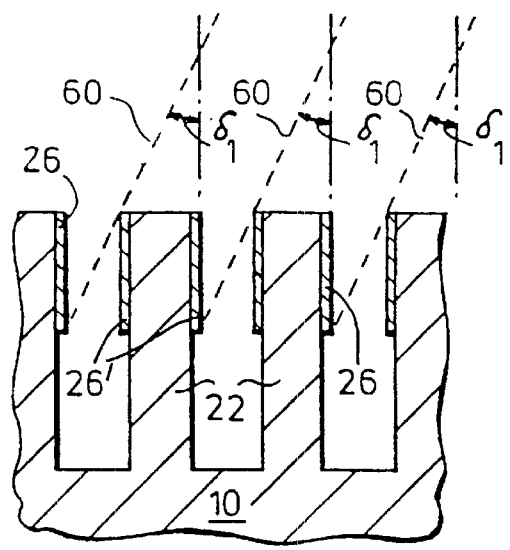
FIGS. 5(a),(b) and (c) are sectional views taken along lines B'—B', C'—C' and D'—D' of FIG. 4 and corresponding to the sections of FIGS. 3(a)–(c)

The shielding for those parts of the channels which are to form the active length L of the printhead is then removed and the channelled body and metal vapour beam are rotated relative to one another to the position shown in FIG. 5(a) such that electrodes are deposited on the channel walls of the portion L for approximately half the height of the walls (giving rise to a typical plating depth of 125 μm) and at a thickness typically equivalent to the deposition of 1 μm on a surface arranged normal to the metal vapour beam. It will be understood that relative rotation needs to be carried out twice to allow both side walls of each channel to be coated. This part of the process corresponds to the electrode deposition method disclosed in EP-A-0 364 136.

Figure 5B:
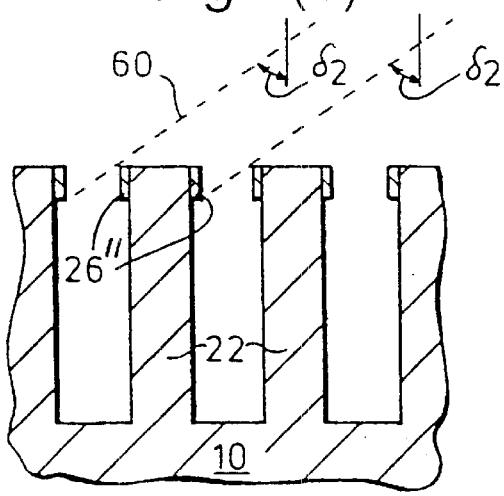
Figure 5C:
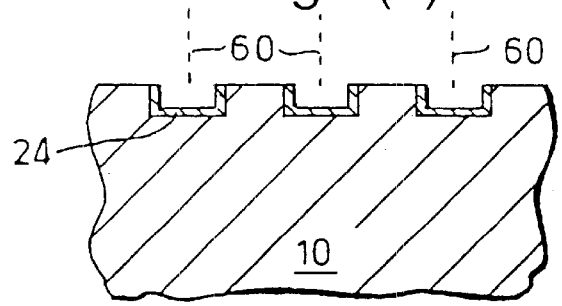

Finally, the shielding for the remainder of the channel, namely portions N and R is removed and the channelled body and metal vapour beam are rotated relative to one another again to the shallower angle shown in FIG. 5(b), thereby to deposit a shallower electrode 26" (typical depth 25 μm) in the portions R,N and also along the top of the electrode 26' deposited in the active region in the previous step. In the active area of the channel, the shallow electrode aids conduction along the length of the active area—this is particularly advantageous where an electrode material having a high resistivity is used. Again, further rotation is required to allow deposition along the top of the other walls.

The method outlined above has the associated advantage that, at each stage of deposition, the deposition parameters can be tailored to achieve optimal electrode characteristics in the particular area being plated. Thus the first stage of deposition can be carried out at a higher rate of deposition so as to lay down—in the minimum time—a layer of metal of a quality sufficient merely to form connection tracks that will remain attached to the ceramic substrate during the wire bonding process. The second stage of deposition of the electrodes in the active length of the channel, on the other hand, can be carried out at a lower deposition rate so as to ensure that the electrodes deposited on the walls in the active part of the channel exhibit electrical continuity. The final stage, in which the shallow electrodes 26" are deposited, can again be carried out at a higher deposition rate that reflects the fact that this electrode is deposited at an angle lying close to the perpendicular.

The shielding may be accomplished by physical masks which are placed between the channelled base 10 and the metal vapour source, preferably proximate the channelled component 10 so as to achieve good edge definition of the plating. The masks are ideally fabricated from a material—such as polyimide or a metal—that is suitable for use in a vacuum system. Each mask has holes formed into it corresponding to the areas to be plated and, in accordance with the method described above, may be removed either by pulling or sliding them away from the channelled base or by hinging them so that each opens in turn after the appropriate stage of deposition. Preferably, each mask is removed without opening the vacuum chamber, which would otherwise result in the formation of oxide layers between successively formed electrode layers.

An alternative electrode deposition method involves initially depositing a shallow electrode along the entire length of a channel. A mask to shield the non-active portion "N" of the channel is then introduced into the chamber prior to depositing, in the conventional manner known from EP-A-0 364 136, a half-wall-depth electrode in the active portion "L" of the channel and connection tracks in the shallow rearward part "C" of the channel.

Unwanted deposition of metal on the tops of walls can be avoided by means of a thermoplastic "lift off" film, as known for example from EP-A-0 397 441, or by lapping after deposition as in EP-A-0 364 136. Further deposition in areas such as the connection tracks in the course of subsequent deposition e.g. of the electrodes 26' or 26" is advantageously taken account of when calculating the required initial deposition thickness of the connection tracks (e.g. only 2 μm of electrode material need be deposited initially in the rearward part "C" of the grooves: electrode material deposited in the rearward part in the course of subsequent deposition steps results in a final target connection track thickness of 3–4 μm.

FIGS. 4 and 5 illustrate the aforementioned aspect of the present invention when applied to a printhead having walls of piezoelectric material polarised normal to the layer of piezoelectric material and in a single direction—the so-called "cantilever construction" disclosed in EP-A-0 354 136. The present invention is by no means restricted to such constructions, however, and can equally well be applied to printheads having a "chevron" construction with piezoelectric material polarised in two opposing directions, as known for example from EP-A-0 277 703. This latter construction has the advantage of requiring a lower operating voltage than the "cantilever" construction but the disadvantage of a higher capacitive load. Use of the present invention is therefore highly appropriate. As will be appreciated, e.g. from the aforementioned EP-A-0 277 703, such constructions require the electrode in the active portion (L) of the channel to extend the entire height of the wall. In the non-active portions, the height of the shallow electrode can be the same as that used in cantilever constructions i.e. typically 25 μm and/or no greater than 20% of the wall height. WO92/09436 describes a laminate from which "chevron" constructions can be made using essentially the same manufacturing techniques as discussed above with regard to "cantilever" designs.

Figure 6:
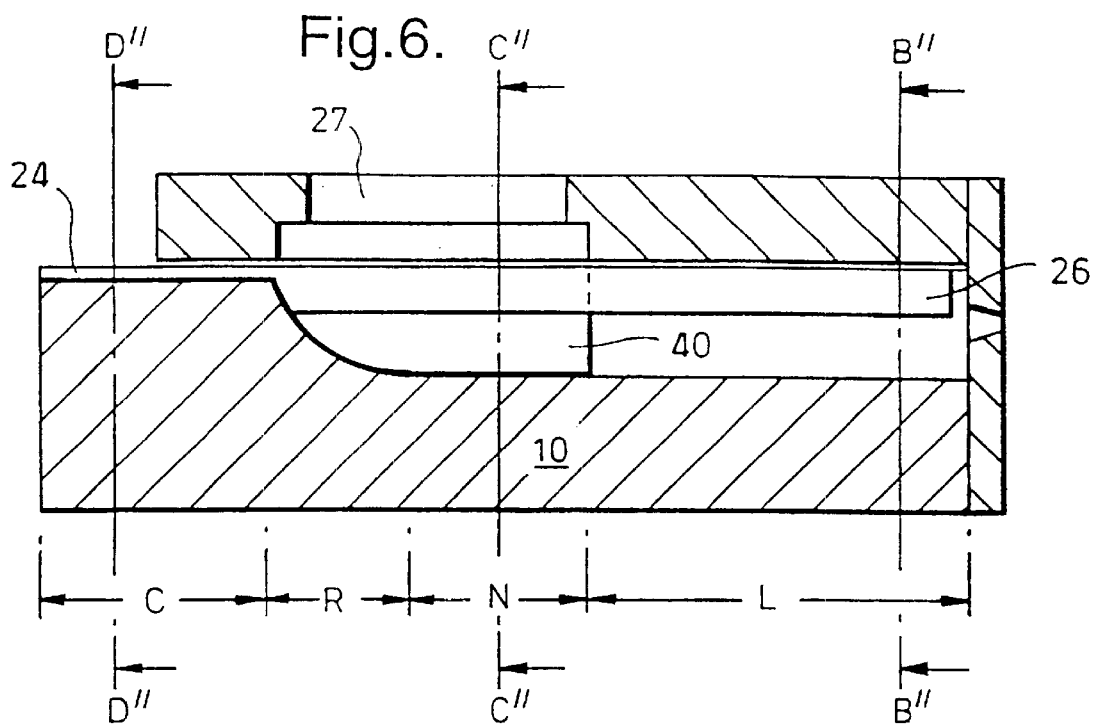
FIG. 6 is a sectional view corresponding to that of FIG. 2 and incorporating a second aspect of the invention.
Figure 7A:
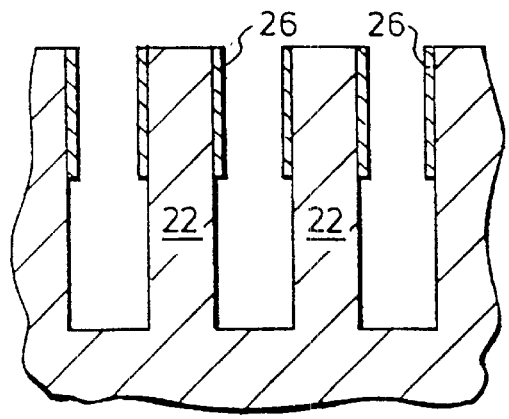
FIGS. 7(a),(b) and (c) are sectional views taken along lines B"—B", C"—C" and D"—D" of FIG. 6 and corresponding to the sections of FIGS. 3(a)–(c)
Figure 7B:
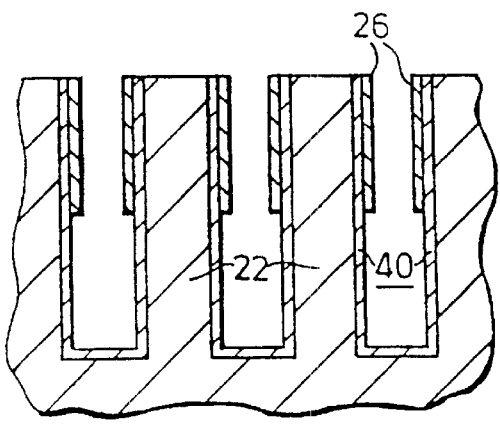

FIG. 6 is a sectional view corresponding to FIG. 2 and illustrating a printhead according to another aspect of the present invention, with FIG. 7 showing corresponding sectional views. As with the previous aspect, the construction of the "active" length of the printhead remains the same as that of the conventional head, with the electrode 26 extending approximately halfway down the wall of piezoelectric material in the case of the "cantilever" actuator shown (and all the way down the wall of piezoelectric material in the case of "chevron" style actuators).

In contrast, the portion (N) of full-depth channel which is open on one side to the ink supply window 27 and which therefore is not part of the "active" length of the channel differs from conventional constructions in that a layer of material 40 having a lower dielectric constant than that of the piezoelectric material is interposed between the electrode 26 and the piezoelectric material of the channel walls 22. This is illustrated in the sectional view of FIG. 7(b).

Figure 8:
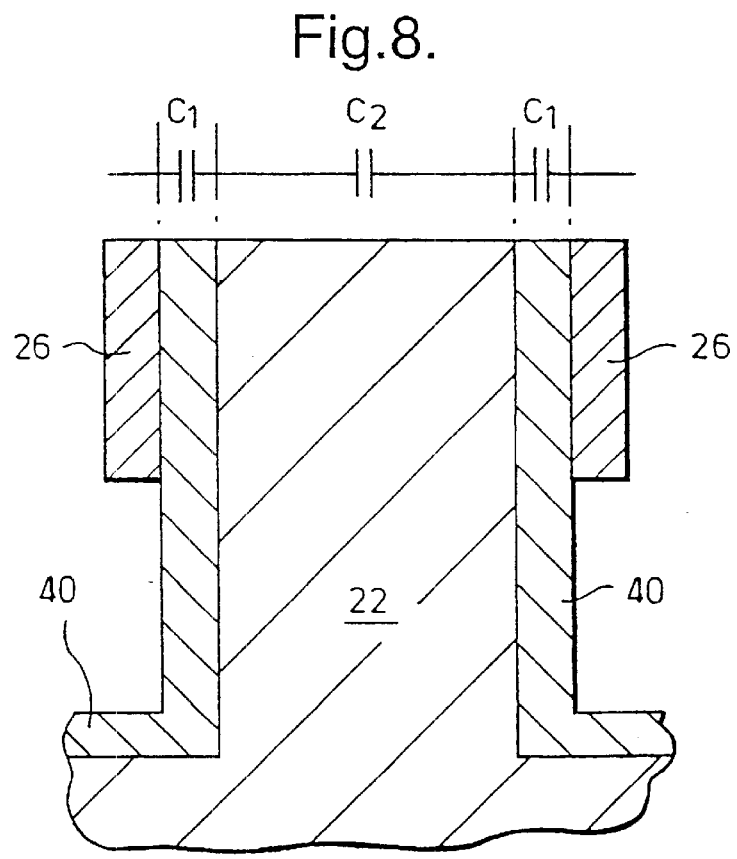
FIG. 8 is a diagrammatic illustration of a section through a channel wall according to the second aspect of the invention.

The capacitive load of the channel wall in this portion of the channel can now be represented by three capacitors in series rather than the single capacitor of conventional designs. As illustrated diagrammatically in FIG. 8, a capacitor C1 is formed across the layer 40 on either side of the wall in addition to the capacitor $C_2$ formed by the piezoelectric material of the wall 22 itself. By choosing a material having a dielectric constant lower than that of the piezoelectric material, the resulting total capacitance of capacitors C1 and C2 in series can be made to be less than that of the piezoelectric material alone. (To a first approximation, the total capacitance is given by $1/C_{total}=1/C_2+2C_1$, whence it can be seen that a low value of $C_1$ will give a low value of $C_{total}$.)

Figure 7C:
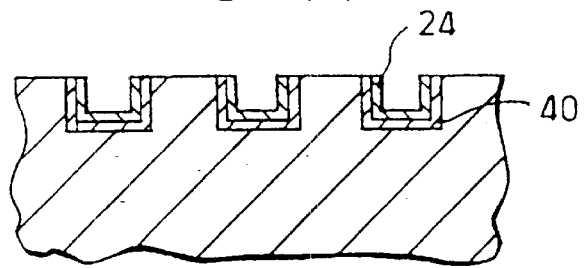

As is clear from FIG. 7(c), this technique can advantageously be applied in the region C of the connection tracks, as well as in the runout region R.

As with the previous aspect of the invention, this aspect can be effected by inventive use of deposition techniques that are known per se. As material having a lower dielectric constant than piezoelectric material, Silicon Nitride can advantageously be used. This has a relative dielectric constant of approximately 8 (as compared with the value of approximately 3600 for a piezoelectric material such as lead zirconium titanate (PZT)) and is conventionally used in inkjet printheads as a protecting passivant coating for the channel electrodes.

Figure 9:
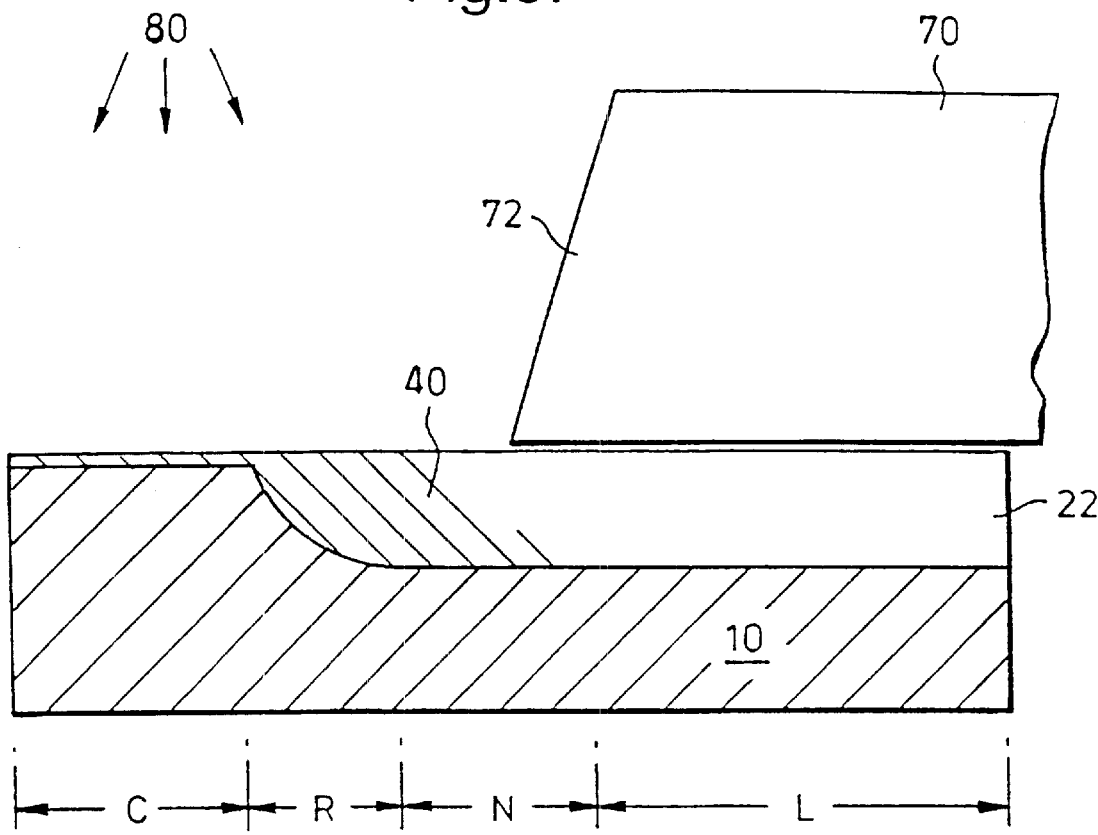
FIG. 9 is a sectional view corresponding to FIG. 6 and illustrates a method step according to the second aspect of the invention.

Such a material can be deposited over the channel walls using techniques known, for example, from WO95/07820 whilst keeping the intended active portion L of the channel masked. The resulting Silicon Nitride layer typically has a thickness in the range 0.3 μm–0.5 μm. The deposition process requires only a single mask arranged so as to prevent the incoming low dielectric material from covering the active length of the channel. As shown in FIG. 9, the mask 70 must make close contact with the tops of the walls 22 in the active region L and must extend a little beyond the active portion L—typically by as much as the channel depth—because the deposition technique used will cause the incoming low dielectric material (Indicated by arrows 80) to penetrate underneath an overhanging region 72 (indeed, the deposition method is intentionally selected for this property in order to fill in the irregular surface of the piezoelectric material). Furthermore, the mask 70 needs to have substantial thickness and to be thermally conductive in order to avoid overheating and distortion during the deposition process. Thus it is typically be made of aluminium of 2–3 mm thickness.

Electrodes can subsequently be deposited over the whole length of the channel in the conventional manner discussed above. Indeed, the passivant is believed to provide a smoother surface for deposition of the electrodes than do the sawn surfaces of the channel walls, with the result that the electrodes in the non-active portions of the channels are less subject to fatigue.

As with the previous aspect of the invention, the use of thermoplastic "lift off" film or lapping has proved satisfactory in removing electrode and low dielectric material deposited on the tops of the channel walls. Again, the invention is equally applicable to "cantilever", "chevron" or any other printhead construction where the piezoelectric material is poled in a direction normal to the layer of piezoelectric material.

Many alternative insulating materials and/or alternative deposition techniques can be used in place of Silicon Nitride for the low dielectric layer: oxides, particularly silicon oxide, aluminium oxide, aluminium nitride and diamond-like carbon. Appropriate choice of material may allow the low dielectric layer and the channel electrode to be deposited using a single piece of deposition apparatus, yielding obvious economies of manufacturing time (there is no need to transfer the channelled component from one machine to another) and capital equipment. For example, a low dielectric layer of aluminium nitride may be deposited on a channelled component in a chamber by evaporating aluminium whilst bombarding the component with nitrogen ions or free radicals. Subsequent evacuation of the chamber will allow the evaporating aluminium to be deposited as an electrode on the channel walls in the same chamber in the fashion known from the aformentioned EP-A-0 364 136.

It will be appreciated that variations on the aspects outlined above are possible within the scope of the present invention. For example, the aforementioned aspects may be used in combination, with the non-active portion "N" of the channel having both a shallow electrode and a layer of low dielectric material interposed between the electrode and the channel side wall. Alternatively, either or both of the aforementioned aspects of the invention can be used in combination with other capacitance-reducing measures.

The relative dimensions of the active and non-active lengths of the channel may also vary from those shown in the figures: high frequency operation of the kind described in EP-A-0 422 870 (and where a low capacitive load is particularly important in view of the high driving frequency) may require active channel lengths (L) at the lower end of the range 10 to 1 mm, for example 4 mm, whilst the dimension of the manifold opening in the longitudinal direction of the channel may need to remain substantially constant—at 10 mm for example—to permit sufficient ink flow without excessive pressure drop, to fit existing ink supply structures, etc. Thus in summary, the present invention is particularly advantageous in printheads having a ratio of non-active full-depth length to active full-depth length of approximately 2 or greater.

Other critical dimensions of such printhead may typically be as follows: full channel depth 300 $\mu$m, electrode depth in active portion of channel 150 $\mu$m, channel wall width in full depth portions (L,N) 62 $\mu$m, length of connection track portion (C) 7.4 mm, channel wall width in connection track portion 47 $\mu$m, overall length of actuator (C+R+N+L) 11.5 mm, active length (L) 1.5 mm.

It will be appreciated that in such designs, use of the present invention results in a greater proportional reduction of the capacitive load of the printhead than in printheads of the kind shown in the figures. For example, in accordance with one aspect of the invention, using a shallow electrode of 25 $\mu$m depth in the non-active portion of a single channel wall having the dimensions described above will result in a total capacitance for the wall of 354 pF as compared with a value of 540 pF for the same wall using an electrode of constant 150 $\mu$m height. Use of a low-dielectric passivant film according to another aspect of the invention will give a total wall capacitance of 190 pF whilst use of both aspects in combination will give a value of wall capacitance of 140 pF. This value is extremely close to that represented by the active part of the wall alone (129 pF).

The invention is not restricted to the printhead configurations shown in the figures: in particular, droplet fluid can be supplied via any channel side lying parallel to the channel axis e.g. via an opening in the channel base as shown in EP-A-0 364 136. Similarly, the nozzle need not be located on the channel axis as shown in the figures but may be situated in the cover or the base (so-called "top-shooter" and "bottom-shooter" designs) or elsewhere as is known in the art. Nor is the apparatus according to the present invention necessarily limited to manufacture by the methods outlined herein: for example, selective application of the electrodes and/or low dielectric layer may be considered after bonding of the top cover to the channelled base. Alternatively, the channelled base and top layer may be incorporated in separate assemblies, each of which is separately subject to manufacturing steps.

Figure 10:
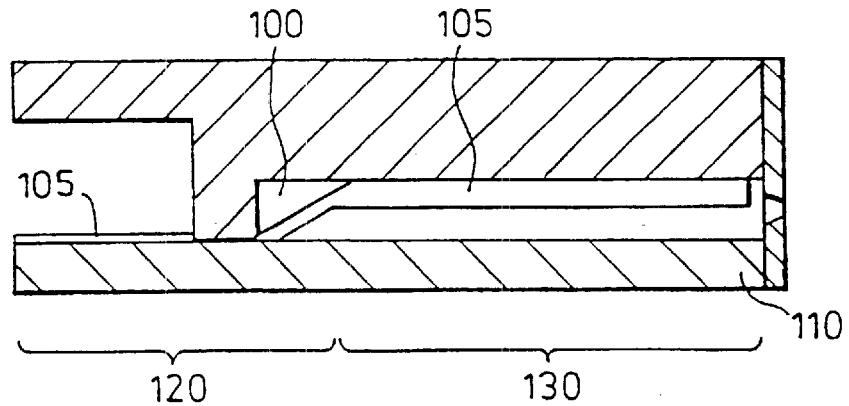
FIG. 10 is a sectional view taken along the longitudinal axis of a channel of another printhead incorporating the present invention.

It will of course be understood that the present invention is applicable to the "wafer scale" manufacturing techniques and constructions described, for example, in WO95/18717. Passivation and electrode deposition masks will necessarily be adapted accordingly. In those constructions where ink is supplied from the end rather than from the side of the channel—for example from a manifold trough 100 running perpendicular to the channel longitudinal axes as shown in FIG. 10—the low dielectric material is simply interposed between the electrode material 105 and the channelled component 110 in those areas 120 lying outside the closed ("active") portions 130 of the channels.

The present invention is also applicable to constructions comprising piezoelectric material polarised in a different manner to the constructions outlined above and having a correspondingly different arrangement of actuating electrodes. An example of such a construction is given in U.S. Pat. No. 5,235,352 which has channel-separating walls which include piezoelectric material polarised parallel to the array direction of the channels and subject by means of electrodes located in the walls themselves to electric fields normal to the direction of polarisation. Low dielectric layers are applied between electrodes and piezoelectric material in those parts of the wall corresponding to non-active, non-closed portions of the channel. Each feature disclosed in this specification (which term includes the claims) and/or shown in the drawings may be incorporated in the invention independently of other disclosed and/or illustrated features.

The text of the abstract filed herewith is repeated here as part of the specification.

A drop-on-demand piezo-electric printhead has channel walls defined by piezo-electric material (10) with electrodes (26) along the length thereof. In portions of the channels which are open to an ink supply conduit the piezo material is locally disabled e.g. by reducing the width of the electrode or by interposing a material (40) of lower dielectric constant between the electrode and the piezo material. A lower capacitive load results.

What is claimed is:

1. Method of making a droplet deposition apparatus including the steps of:
    (a) forming a multiplicity of parallel channels in a bottom sheet comprising a layer of piezo-electric material, each channel defined at least in part by facing side walls and by a bottom surface extending between the side walls, at least the side walls comprising piezo-electric material;
    (b) depositing a layer of material on at least one of the facing side walls of a first portion of each of said channels, the material having a dielectric constant lower than that of the piezo-electric material, the facing side walls of a second portion of each of said channels remaining free of said material;

(c) subsequently depositing electrode material on the facing side walls of said first and second portions of said channels.

2. Method according to claim 1, and including the steps of (d) masking said second portion of each of said channels prior to depositing said layer of material on at least one of the facing side walls of said first portion of each of said channels;

(e) unmasking said second portion prior to depositing electrode material on the facing side walls of said first and second portions of said channels.

3. Method according to claim 1 and wherein electrode material is deposited by means of metal vapour beams directed at said walls and at angle to channel facing surfaces thereof.

4. Method of making a droplet deposition apparatus including the steps of:

(a) forming in a bottom sheet comprising a layer of piezo-electric material a multiplicity of parallel channels separated by channel walls having co-planar tops, each channel defined at least in part by facing side walls and by a bottom surface extending between said side walls, at least the side walls comprising said piezo-electric material;

(b) depositing electrode material on the facing side walls of a first portion of each of said channels over a first proportion of the height of the respective side walls;

(c) depositing electrode material on the facing side walls of a second portion of each of said channels over a second proportion of the height of the respective side walls, said first and second proportions being different;

(d) masking said second portion of each of said channels prior to depositing electrode material on the facing walls of said first portion of each of said channels over a first proportion of the height of the respective side walls; and (e) unmasking said second portion prior to depositing electrode material on the facing side walls of said first and second portions of each of said channels.

5. Method according to claim 4 wherein said first proportion is greater than said second proportion.

6. Method according to claim 5 wherein said second proportion is no greater than 10% of the height of the respective side walls.

7. Method according to claim 4 wherein electrode material is deposited by means of metal vapour beams directed at said walls and at an angle to channel facing surfaces thereof, the angle for deposition in said first portion being steeper than the angle for deposition in said second portion.

* * * * *

UNITED STATES PATENT AND TRADEMARK OFFICE
CERTIFICATE OF CORRECTION

PATENT NO.      : 6,618,943 B2
DATED           : September 16, 2003
INVENTOR(S)     : James Ashe et al.

It is certified that error appears in the above-identified patent and that said Letters Patent is hereby corrected as shown below:

Title page,
Item [75], Inventor, please delete "Beds (KR);" and replace with -- Beds (GB); --.
please delete "Cambridge (KR)" and replace with -- Cambridge (GB) --.

Signed and Sealed this

Twenty-second Day of February, 2005

JON W. DUDAS
*Director of the United States Patent and Trademark Office*